United States Patent
Morikazu (10) Patent No.: US 9,543,466 B2
(45) Date of Patent: Jan. 10, 2017

(54) METHOD FOR FORMING SHIELD TUNNELS IN SINGLE-CRYSTAL SUBSTRATES

(71) Applicant: DISCO CORPORATION, Tokyo (JP)

(72) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/013,041

(22) Filed: Feb. 2, 2016

(65) Prior Publication Data

US 2016/0225945 A1    Aug. 4, 2016

(30) Foreign Application Priority Data

Feb. 2, 2015   (JP) ................. 2015-018629

(51) Int. Cl.
*H01L 21/00* (2006.01)
*H01L 33/00* (2010.01)
*H01L 21/78* (2006.01)

(52) U.S. Cl.
CPC .......... *H01L 33/0095* (2013.01); *H01L 21/78* (2013.01)

(58) Field of Classification Search
None
See application file for complete search history.

(56) References Cited

U.S. PATENT DOCUMENTS

| 4,589,190 | A | * | 5/1986 | Anthony | ............... | H01L 21/268 257/330 |
| 2010/0203678 | A1 | * | 8/2010 | Fukumitsu | ......... | B23K 26/0884 438/113 |
| 2011/0300691 | A1 | * | 12/2011 | Sakamoto | .......... | B23K 26/0057 438/462 |
| 2014/0334511 | A1 | * | 11/2014 | Takeda | ..................... | H01S 3/10 372/41 |

FOREIGN PATENT DOCUMENTS

| JP | 10-305420 | 11/1998 |
| JP | 2002-192370 | 7/2002 |

* cited by examiner

*Primary Examiner* — Julio J Maldonado
*Assistant Examiner* — Cory Eskridge
(74) *Attorney, Agent, or Firm* — Greer Burnes & Crain Ltd.

(57) ABSTRACT

A method of processing a single-crystal member includes setting the peak energy density of a pulsed laser beam to a value in a range from 1 $TW/cm^2$ to 100 $TW/cm^2$, and applying the pulsed laser beam to the single-crystal member while positioning a converged point of the pulsed laser beam at a predetermined position spaced from an upper side of the single-crystal member to grow a fine hole and a amorphous region shielding the fine hole from the upper side of the single-crystal member, thereby forming a shield tunnel in the single-crystal member.

2 Claims, 7 Drawing Sheets

METHOD FOR FORMING SHIELD TUNNELS IN SINGLE-CRYSTAL SUBSTRATES

BACKGROUND OF THE INVENTION

Field of the Invention

The present invention relates to a method of processing a single-crystal member such as a sapphire ($Al_2O_3$) substrate, a silicon carbide (SiC) substrate, a gallium nitride (GaN) substrate, or the like.

Description of the Related Art

In an optical device fabrication process, an optical device layer made up of an n-type nitride semiconductor layer and a p-type nitride semiconductor layer is stacked on the surface of a sapphire ($Al_2O_3$) substrate, a silicon carbide (SiC) substrate, or a gallium nitride (GaN) substrate, and optical devices such as light-emitting diodes, laser diodes, or the like are formed in a plurality of regions divided by a plurality of division lines formed in a grid pattern, thereby producing an optical device wafer. Then, a laser beam is applied to the optical device wafer along the division lines to cut the optical device wafer, dividing the regions with the optical devices formed therein thereby to manufacture individual optical devices.

As a method of dividing wafers such as the above optical device wafers, there has been tried a laser processing method that uses a pulsed laser beam having a wavelength permeable to the workpiece, wherein the pulsed laser beam is applied to the workpiece while positioning a converged point thereof within an area to be divided. A dividing process using such a laser processing method is a technology for dividing a wafer by applying a pulsed laser beam having a wavelength permeable to the wafer from one surface of the wafer while positioning a converged point of the laser beam within the wafer thereby to form a succession of modified layers serving as rupture start points along a division line within the wafer and applying an external force to the wafer along a street where the strength is lowered by the modified layers formed (see, for example, Japanese Patent No. 3408805).

Furthermore, as a method of dividing a wafer such as a semiconductor wafer, an optical device wafer, or the like along a division line, there has been put into practical use a technology for performing an ablation process on a wafer by irradiating the wafer with a pulsed laser beam having a wavelength absorbable by the wafer along a division line thereby to form laser-processed grooves, and applying an external force along the division line where the laser-processed grooves have been formed as rupture start points, thereby splitting the wafer (see, for example, Japanese Patent Laid-open No. 1998-305420).

SUMMARY OF THE INVENTION

However, either one of the above processing methods is problematic in that the productivity is poor because in order to divide an optical device wafer made of a sapphire ($Al_2O_3$) substrate or the like into individual devices along a division line, it is necessary to apply a laser beam to the same division line a plurality of times.

It is therefore an object of the present invention to provide a method of processing a single-crystal member in a manner to be able to laser-process the single-crystal member efficiently to a desired thickness.

In accordance with an aspect of the present invention, there is provided a method of processing a single-crystal member, including setting a peak energy density of a pulsed laser beam to a value in a range from 1 $TW/cm^2$ to 100 $TW/cm^2$, and applying the pulsed laser beam to the single-crystal member while positioning a converged point of the pulsed laser beam at a predetermined position spaced from an upper side of the single-crystal member to grow a fine hole and an amorphous region shielding the fine hole from the upper side of the single-crystal member, thereby forming a shield tunnel in the single-crystal member.

Preferably, the method of processing a single-crystal member includes continuously forming the shield tunnels along a plurality of division lines formed on the single-crystal member, and dividing the single-crystal member along the division lines with the shield tunnels continuously formed therealong.

With the method of processing a single-crystal member according to the present invention, the peak energy density of a pulsed laser beam is to a value in a range from 1 $TW/cm^2$ to 100 $TW/cm^2$, and the pulsed laser beam is applied to the single-crystal member while positioning a converged point thereof at a predetermined position spaced from an upper side of the single-crystal member to grow fine holes and amorphous regions shielding the fine holes in the single-crystal member from the upper side of the single-crystal member, thereby forming shield tunnels in the single-crystal member. Consequently, by adjusting the output power of the pulsed laser beam to an appropriate level, it is possible to form the shield tunnels from the upper side to the lower side of the single-crystal member with the pulsed laser beam applied only once. Even if the single-crystal member is of an increased thickness, the pulsed laser beam needs to be applied only once to the single-crystal member, and hence the productivity of the shield tunnels is increased.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
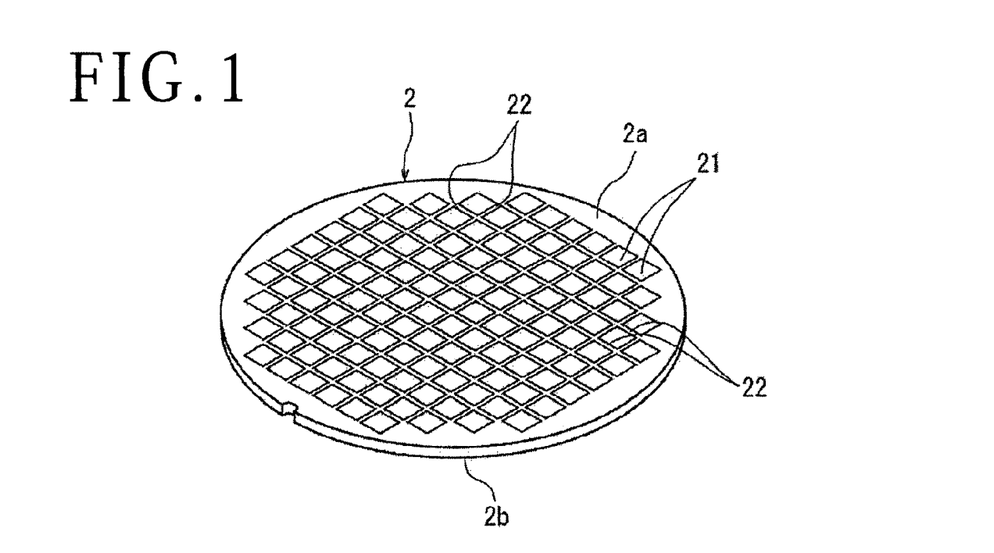
FIG. 1 is a perspective view of an optical device wafer as a single-crystal member.

A method of processing a single-crystal member according to the present invention will be described in detail below with reference to the attached drawings. FIG. 1 shows in perspective an optical device wafer as a single-crystal member which is to be processed by the method of processing a single-crystal member according to the present invention. As shown in FIG. 1, an optical device wafer 2 has a matrix of optical devices 21 such as light-emitting diodes, laser diodes, or the like disposed on an upper surface 2a of a sapphire ($Al_2O_3$) substrate having a thickness of 400 μm. The optical devices 21 are separated by division lines 22 formed in a grid pattern.

Figure 2:
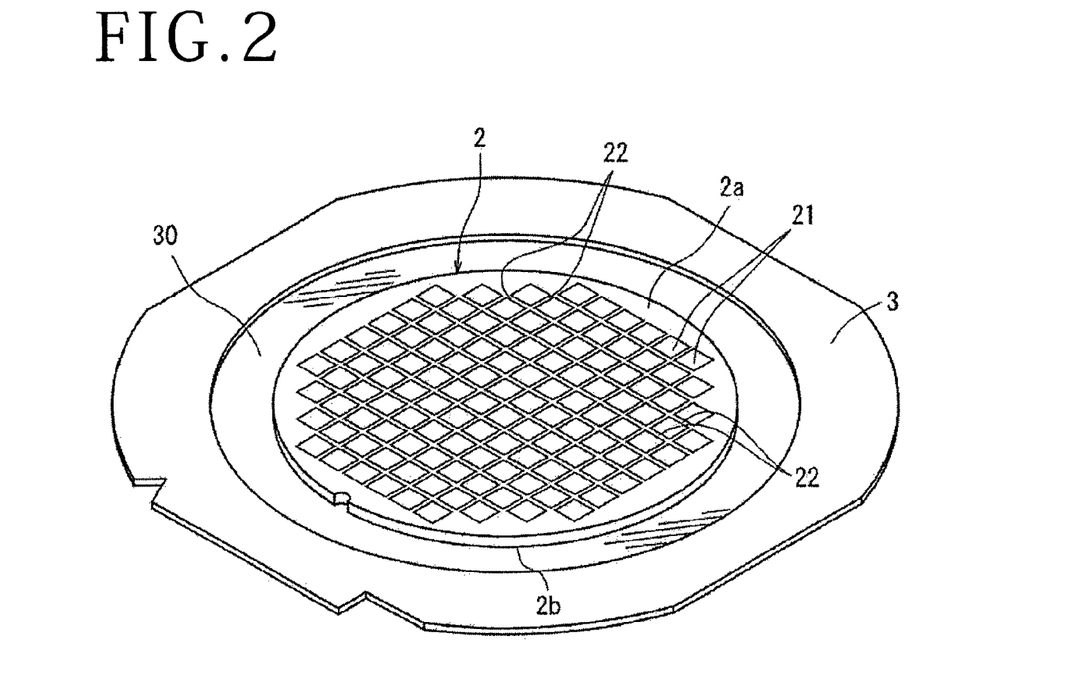
FIG. 2 is a perspective view showing the manner in which the optical device wafer shown in FIG. 1 is adhered to a dicing tape mounted on an annular frame.

The method of processing a single-crystal member, i.e., processing the optical device wafer 2 as a single-crystal member, will be described below. First, a wafer supporting step wherein the optical device wafer 2 is adhered to the surface of a dicing tape mounted on an annular frame is carried out. Specifically, as shown in FIG. 2, a reverse surface 2b of the optical device wafer 2 is adhered to the surface of a dicing tape 30 whose outer circumferential portion has been mounted on an annular frame 3 in covering relation to an inner opening of the frame 3. The optical device wafer 2 that is adhered to the upper surface of the dicing tape 30 has its upper surface 2a facing upwardly.

Figure 3:
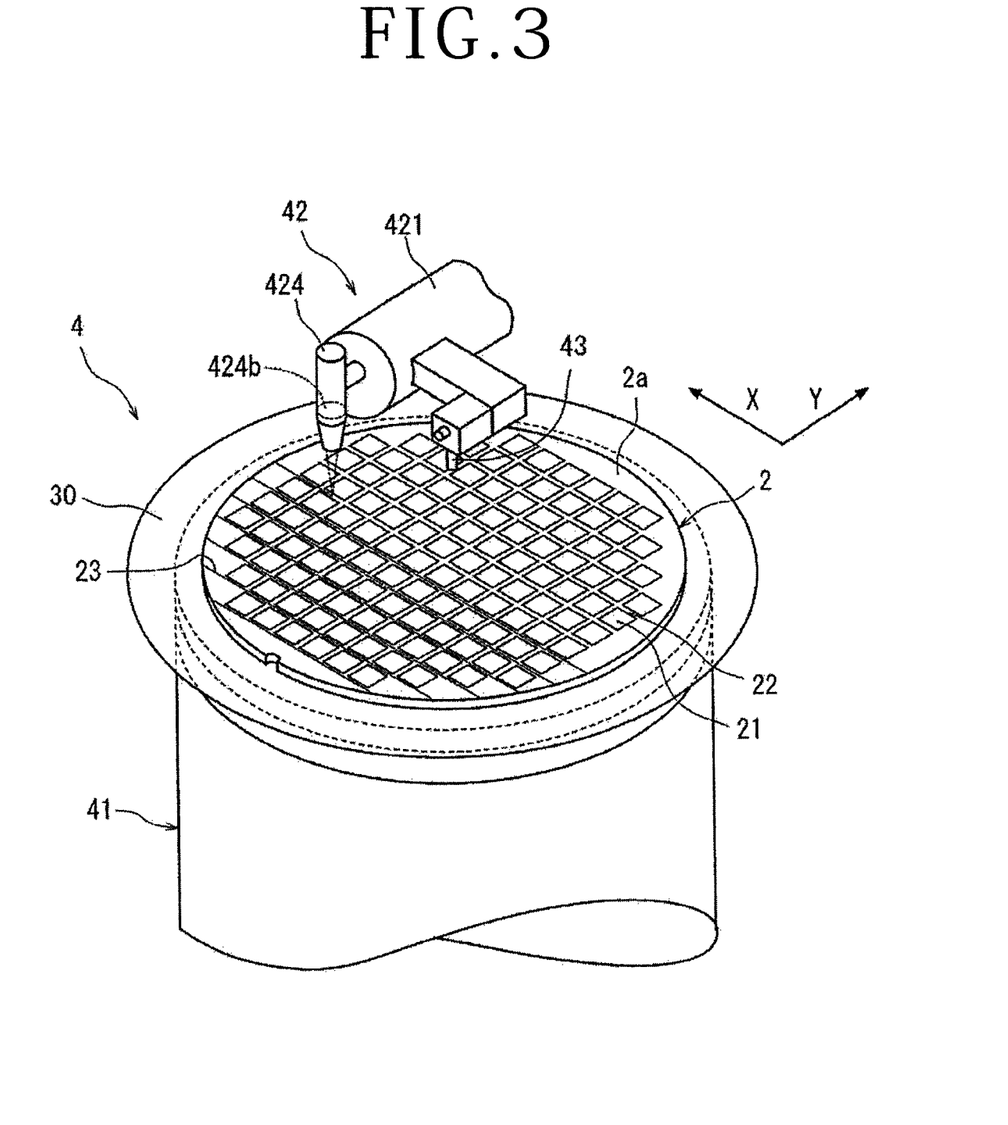
FIG. 3 is a perspective view of essential parts of a laser processing apparatus that is suitable for performing a shield tunnel forming step.
Figure 4:
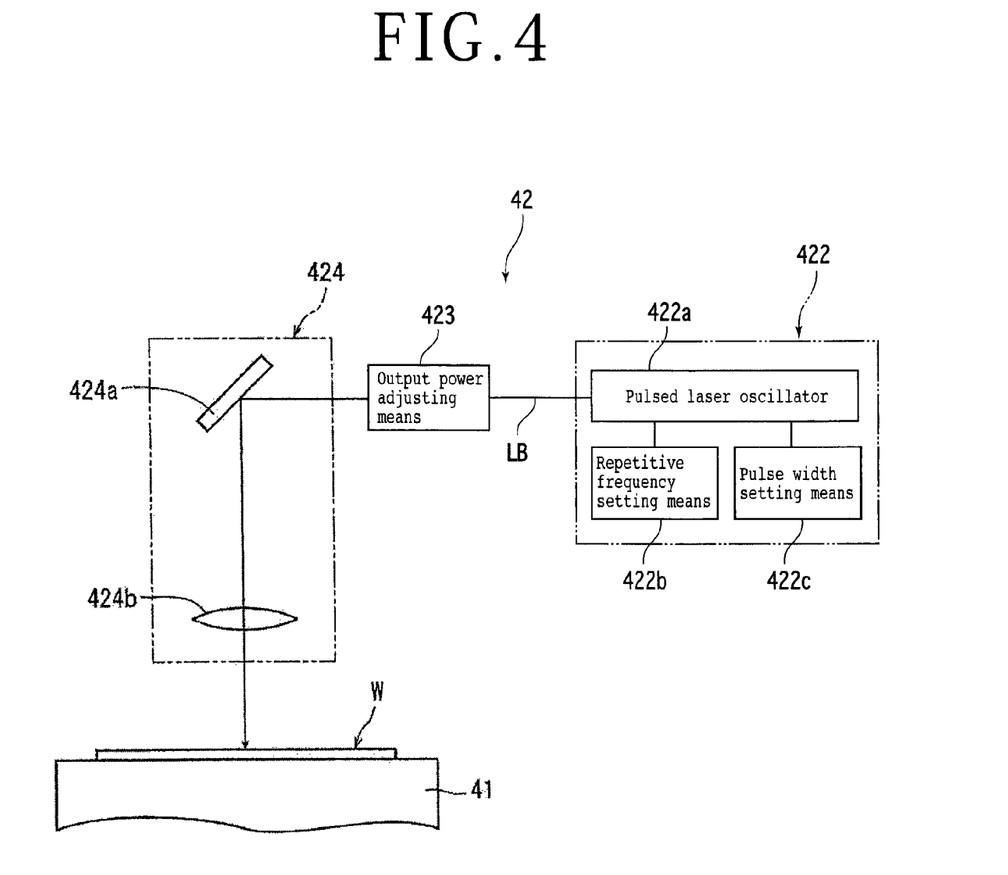
FIG. 4 is a block diagram of pulsed laser beam oscillating means included in the laser processing apparatus shown in FIG. 3.

FIG. 3 shows in perspective essential parts of a laser processing apparatus that laser-processes the optical device wafer 2 on which the above wafer supporting step has been carried out along division lines 22. FIG. 4 shows in block form pulsed laser beam oscillating means included in the laser processing apparatus shown in FIG. 3. A laser processing apparatus 4 shown in FIG. 3 has a chuck table 41 that holds a workpiece, laser beam applying means 42 that applies a laser beam to the workpiece held on the chuck table 41, and image capturing means 43 that captures an image of the workpiece held on the chuck table 41. The chuck table 41, which is arranged to hold the workpiece under suction, is movable along a feeding direction indicated by an arrow X in FIG. 3 by feeding means not depicted, and along an indexing direction indicated by an arrow Y in FIG. 3 by indexing means not depicted.

The laser beam applying means 42 includes a casing 421 of a hollow cylindrical shape extending essentially horizontally. As shown in FIG. 4, the laser beam applying means 42 has pulsed laser beam oscillating means 422 disposed in the casing 421, output power adjusting means 423 for adjusting the output power of a pulsed laser beam emitted from the pulsed laser beam oscillating means 422, and a converging unit (condenser) 424 for converging the pulsed laser beam whose output power has been adjusted by the output power adjusting means 423 and applying the converged pulsed laser beam to the optical device wafer 2 which is held as the workpiece on a holding surface that is provided as the upper surface of the chuck table 41. The pulsed laser beam oscillating means 422 includes a pulsed laser oscillator 422a, repetitive frequency setting means 422b for setting a repetitive frequency for the pulsed laser beam oscillated by the pulsed laser oscillator 422a, and pulse width setting means 422c for setting a pulse width for the pulsed laser beam oscillated by the pulsed laser oscillator 422a. According to the present embodiment, the pulsed laser beam oscillating means 422 thus arranged oscillates a pulsed laser beam LB having a wavelength of 1030 nm. The pulsed laser beam oscillating means 422 and the output power adjusting means 423 are controlled by control means not depicted.

Figure 5:
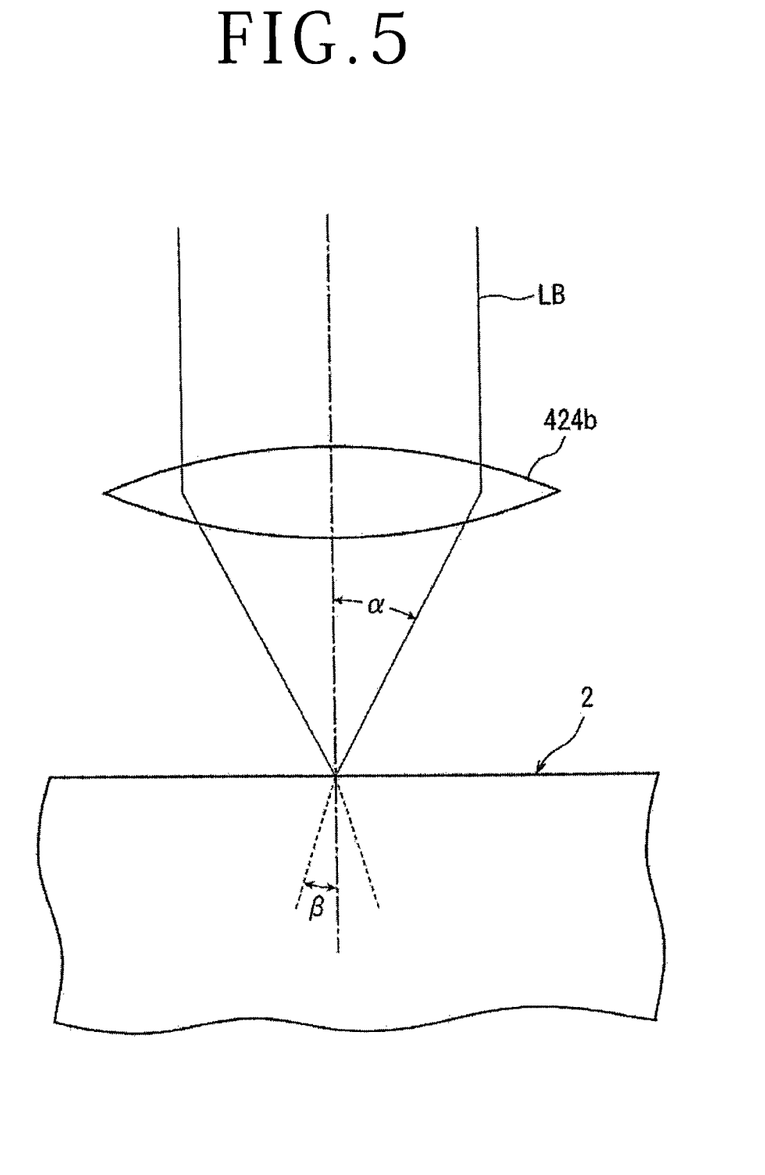
FIG. 5 is a diagram showing the relationship between a numerical aperture (NA) of a condensing lens, a refractive index (N) of the optical device wafer, and a value (S=NA/N) obtained by dividing the numerical aperture (NA) by the refractive index (N)

The converging unit 424 includes a direction changing mirror 424a for changing the direction of the pulsed laser beam LB downwardly which has been oscillated by the pulsed laser beam oscillating means 422 and whose output power has been adjusted by the output power adjusting means 423, and a condensing lens 424b for converging the pulsed laser beam which has been changed in direction by the direction changing mirror 424a and applying the converged pulsed laser beam LB to the workpiece W held on the holding surface as the upper surface of the chuck table 41. The present inventor has confirmed that a shield tunnel is formed insofar as a value obtained by dividing the numerical aperture (NA) of the condensing lens 424b of the converging unit 424 by the refractive index (N) of the single-crystal member is in the range from 0.05 to 0.4. The relationship among the numerical aperture (NA), the refractive index (N), and the value (S=NA/N) obtained by dividing the numerical aperture (NA) by the refractive index (N) will be described below with reference to FIG. 5. In FIG. 5, the pulsed laser beam LB applied to the condensing lens 424b is converged at an angle (α) with respect to the optical axis. At this time, sin α represents the numerical aperture (NA) of the condensing lens 424b (NA=sin α).

When the pulsed laser beam LB converged by the condensing lens 424b is applied to the optical device wafer 2 as the single-crystal member, since the single-crystal member in the form of the optical device wafer 2 has its density higher than air, the pulsed laser beam LB is refracted from the angle (α) to an angle (β). At this time, the angle (β) with respect to the optical axis differs depending on the refractive index (N) of the single-crystal member as the optical device wafer 2. As the refractive index (N) is expressed as (N=sin α/sin β), the value (S=NA/N) obtained by dividing the numerical aperture (NA) by the refractive index (N) of the single-crystal member is represented by sin β. It has been experimentally confirmed that a good shield tunnel is formed by setting sin β to the range from 0.05 to 0.4 (0.05≤sin β≤0.4), and that no good shield tunnel is formed if sin β falls outside the set range even though the peak energy density is in its desired range to be described later. The laser beam applying means 42 has converged point position adjusting means (not depicted) for adjusting the position of the converged point of the pulsed laser beam LB that is converged by the condensing lens 424b of the converging unit 424.

The image capturing means 43, which is mounted on a distal end portion of the casing 421 of the laser beam applying means 42, includes, in addition to an ordinary image capturing device (CCD) which captures an image with a visible beam, infrared radiation applying means for applying an infrared radiation to the workpiece, an optical system for capturing the infrared radiation applied by the infrared radiation applying means, and an image capturing device (infrared CCD) for outputting an electric signal corresponding to the infrared radiation captured by the optical system. The image capturing means 43 transmits a captured image signal to the control means, not depicted.

For laser-processing the optical device wafer 2 on which the above wafer supporting step has been performed along the division lines 22 using the laser processing apparatus 4, a positioning step is carried out to position the condensing lens 424b and the single-crystal member relatively along the optical axis in order to position the converged point of the pulsed laser beam LB at a desired position along the thicknesswise direction of the optical device wafer 2 as the single-crystal member.

First, the dicing tape 30 to which the optical device wafer 2 has been adhered is placed on the chuck table 41 of the laser processing apparatus 4 shown in FIG. 3. Then, suction means, not depicted, is actuated to hold the optical device wafer 2 on the chuck table 41 through the intermediary of the dicing tape 30 (wafer holding step). Therefore, the optical device wafer 2 held on the chuck table 41 has its upper surface 2a facing upwardly. The annular frame 3 with the dicing tape 30 mounted thereon, which is omitted from illustration in FIG. 3, is held by appropriate frame holding means disposed on the chuck table 41. The chuck table 41 which has thus held the optical device wafer 2 under suction is positioned immediately below the image capturing means 43 by the feeding means not depicted.

When the chuck table 41 is positioned immediately below the image capturing means 43, the image capturing means 43 and the control means not illustrated carry out an alignment process to detect an area to be laser-processed of the optical device wafer 2. Specifically, the image capturing means 43 and the control means not illustrated perform image processing such as pattern matching or the like to position a division line 22 extending along a first direction on the optical device wafer 2 and the converging unit 424 of the laser beam applying means 42 which applies the laser beam along the division line 22, thereby aligning a laser beam applying position (alignment step). A laser beam applying position is similarly aligned with respect to a division line 22 that extends on the optical device wafer 2 perpendicularly to the above first direction.

Figures 6A, 6B:
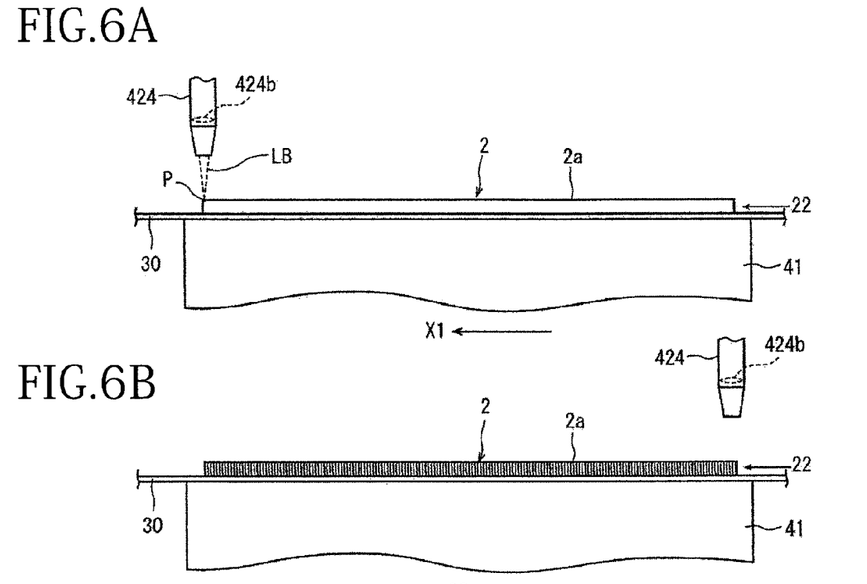
FIGS. 6A through 6E are views illustrating the shield tunnel forming step.

After the above alignment process has been carried out, as shown in FIG. 6A, the chuck table 41 is moved to a laser beam applying area where the converging unit 424 of the laser beam applying means 42 that applies the laser beam is positioned, positioning the predetermined division line 22 immediately below the converging unit 424. At this time, as shown in FIG. 6A, one end (the left end in FIG. 6A) of the division line 22 on the optical device wafer 2 is positioned immediately below the converging unit 424. Then, the non-illustrated converged point position adjusting means is actuated to move the converging unit 424 along the optical axis in order to position a converged point P of the pulsed laser beam LB converged by the condensing lens 424b of the converging unit 424 at a desired position along the thicknesswise direction of the optical device wafer 2 as the single-crystal member (positioning step). According to the present embodiment, the converged point P of the pulsed laser beam is set to the desired position spaced from the upper surface (the upper surface 2a side) of the optical device wafer 2 to which the pulsed laser beam is applied (e.g., a position spaced 5 through 10 μm from the upper surface 2a to the reverse surface 2b).

After the positioning step has been carried out as described above, a shield tunnel forming step is carried out to operate the laser beam applying means 42 to emit the laser beam LB from the converging unit 424 and form a fine hole and an amorphous region shielding the fine hole which extend from a region in the vicinity of the converged point P (the upper side or the upper surface 2a) positioned on the optical device wafer 2 toward the lower side (the reverse surface 2b), thereby forming a shield tunnel. Specifically, while the converging unit 424 is emitting the pulsed laser beam LB which has a wavelength permeable to the sapphire substrate forming the optical device wafer 2, the chuck table 41 is moved at a predetermined feed speed along the direction indicated by the arrow X1 in FIG. 6A (shield tunnel forming step). Then, as shown in FIG. 6B, when the other end (the right end in FIG. 6B) of the division line 22 reaches the laser beam applying position of the converging unit 424 of the laser beam applying means 42, the laser beam applying means 42 stops applying the pulsed laser beam, and the chuck table 41 stops moving.

Figures 6C, 6D, 6E:
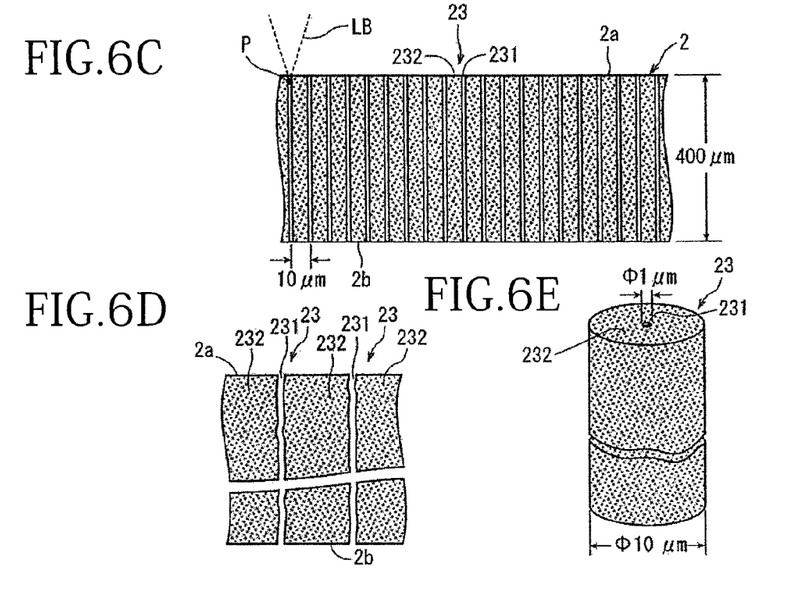

When the above shield tunnel forming step is carried out, as shown in FIG. 6C, fine holes 231 and amorphous regions 232 formed around the fine holes 231 are grown in the optical device wafer 2 such that they extend from a region in the vicinity of the converged point P (the upper side or the upper surface 2a) of the pulse layer beam LB toward the lower side (the reverse surface 2b), thereby forming amorphous shield tunnels 23 at predetermined intervals (according to the present embodiment, intervals of 10 μm (feed speed: 1000 mm/second)/(repetitive frequency: 100 kHz)) along the division line 22. As shown in FIGS. 6D and 6E, each of the shield tunnels 23 includes a centrally formed fine hole 231 having a diameter of about 1 μm and an amorphous region 232 having a diameter of about 10 μm disposed around the fine hole 231. According to the present embodiment, those amorphous regions 232 which are disposed adjacent to each other are joined to each other. Since the amorphous shield tunnels 23 formed in the shield tunnel forming step can be formed so as to extend from the upper surface (the upper surface 2a) of the optical device wafer 2 toward the lower surface (the reverse surface 2b) thereof, the pulsed laser beam may be applied only once even if the thickness of the wafer is large. Therefore, the productivity of the shield tunnels 23 is highly increased. Furthermore, as no debris is scattered in the shield tunnel forming step, the problem of a reduced device quality is also solved.

After the shield tunnel forming step is carried out along the predetermined division line 22 as described above, the chuck table 41 is indexed by the interval between division lines 22 on the optical device wafer 2 along the direction indicated by the arrow Y (indexing step), and then the above shield tunnel forming step is performed. When the shield tunnel forming step has been carried out along all the division lines 22 that extend along the first direction, the chuck table 41 is rotated 90 degrees, and then the shield tunnel forming step is carried out along division lines 22 extending along a direction perpendicular to the division lines 22 along the first direction.

In the above embodiment, the optical device wafer 2 is held on the chuck table 41 with the upper surface 2a facing upwardly, and the pulsed laser beam is applied from the side of the upper surface 2a of the optical device wafer 2 along the division lines 22 to form the shield tunnels 23. However, the optical device wafer 2 may be held on the chuck table 41 with the reverse surface 2b facing upwardly and the pulsed laser beam may be applied from the side of the reverse surface 2b of the optical device wafer 2 along the division lines 22 to form the shield tunnels 23.

In order to form good shield tunnels 23 in the above shield tunnel forming step, it is important to set the peak energy density of the pulsed laser beam LB to a value in a range from 1 TW/cm$^2$ to 100 TW/cm$^2$. The peak energy density can be determined as average output power (W)/{repetitive frequency (Hz)×spot area (cm$^2$)×pulse width (s)}.

The reasons why the peak energy density of the pulsed laser beam LB is set to a value in the range from 1 TW/cm$^2$ to 100 TW/cm$^2$ will be described below.

Experiment 1

Condition 1 . . . single-crystal member: sapphire substrate (having a thickness of 400 μm)

Condition 2 . . . the wavelength of the pulsed laser beam is set to 1030 nm.

Condition 3 . . . the repetitive frequency of the pulsed laser beam is set to 100 kHz.

Condition 4 . . . the spot diameter of the pulsed laser beam is set to 10 μm.

Condition 5 . . . the average output power of the pulsed laser beam is set to 5 W.

Condition 6 . . . variable: the pulse width of the pulsed laser beam

The pulsed laser beam was applied to the sapphire substrate while the pulse width was varied from 0.1 to 100 ps under the above conditions, and the processed state was observed.

When the pulse width ranged from 0.1 to less than 0.6 ps, voids were formed within the sapphire substrate.

When the pulse width ranged from 0.6 to 63 ps, shield tunnels including fine holes and amorphous regions shielding the fine holes were formed within the sapphire substrate.

When the pulse width ranged from 64 to 100 ps, the inside of the sapphire substrate was melted.

It can be seen from the above experimental results that shield tunnels including fine holes and amorphous regions shielding the fine holes are formed within the sapphire substrate when the pulse width is in the range from 0.6 to 63 ps.

Consequently, the peak energy density is determined with the pulse width in the range from 0.6 to 63 ps under the above conditions, and shield tunnels are formed by setting the peak energy density to a value in the range from 1 $TW/cm^2$ to 100 $TW/cm^2$.

Experiment 2

Condition 1 . . . single-crystal member: sapphire substrate (having a thickness of 400 μm)

Condition 2 . . . the wavelength of the pulsed laser beam is set to 1030 nm.

Condition 3 . . . the pulse width is set to 10 ps.

Condition 4 . . . the spot diameter of the pulsed laser beam is set to 10 μm.

Condition 5 . . . the average output power of the pulsed laser beam is set to 5 W.

Condition 6 . . . variable: the repetitive frequency of the pulsed laser beam

The pulsed laser beam was applied to the sapphire substrate while the repetitive frequency was varied from 1 to 1000 kHz under the above conditions, and the processed state was observed.

When the repetitive frequency ranged from 1 to 6 kHz, the inside of the sapphire substrate was broken and cracks were radially developed therein.

When the repetitive frequency ranged from 7 to 640 kHz, shield tunnels including fine holes and amorphous regions shielding the fine holes were formed within the sapphire substrate.

When the repetitive frequency ranged from 650 to 1000 kHz, voids were formed within the sapphire substrate and no shield tunnels were formed therein.

It can be seen from the above experimental results that shield tunnels including fine holes and amorphous regions shielding the fine holes are formed within the sapphire substrate when the repetitive frequency is in the range from 7 to 640 kHz.

Consequently, the peak energy density is determined with the repetitive frequency in the range from 7 to 640 kHz under the above conditions, and shield tunnels are formed by setting the peak energy density to a value in the range from 1 $TW/cm^2$ to 100 $TW/cm^2$.

Experiment 1 and Experiment 2 were conducted on the sapphire ($Al_2O_3$) substrate. Experiments similar to Experiment 1 and Experiment 2 were also conducted on a silicon carbide (SiC) substrate, a gallium nitride (GaN) substrate, a lithium tantalate ($LiTaO_3$) substrate, a lithium niobate ($LiNbO_3$) substrate, a diamond substrate, and a quartz ($SiO_2$) substrate, each as a single-crystal member, and the results of those experiments were essentially the same.

Figure 7:
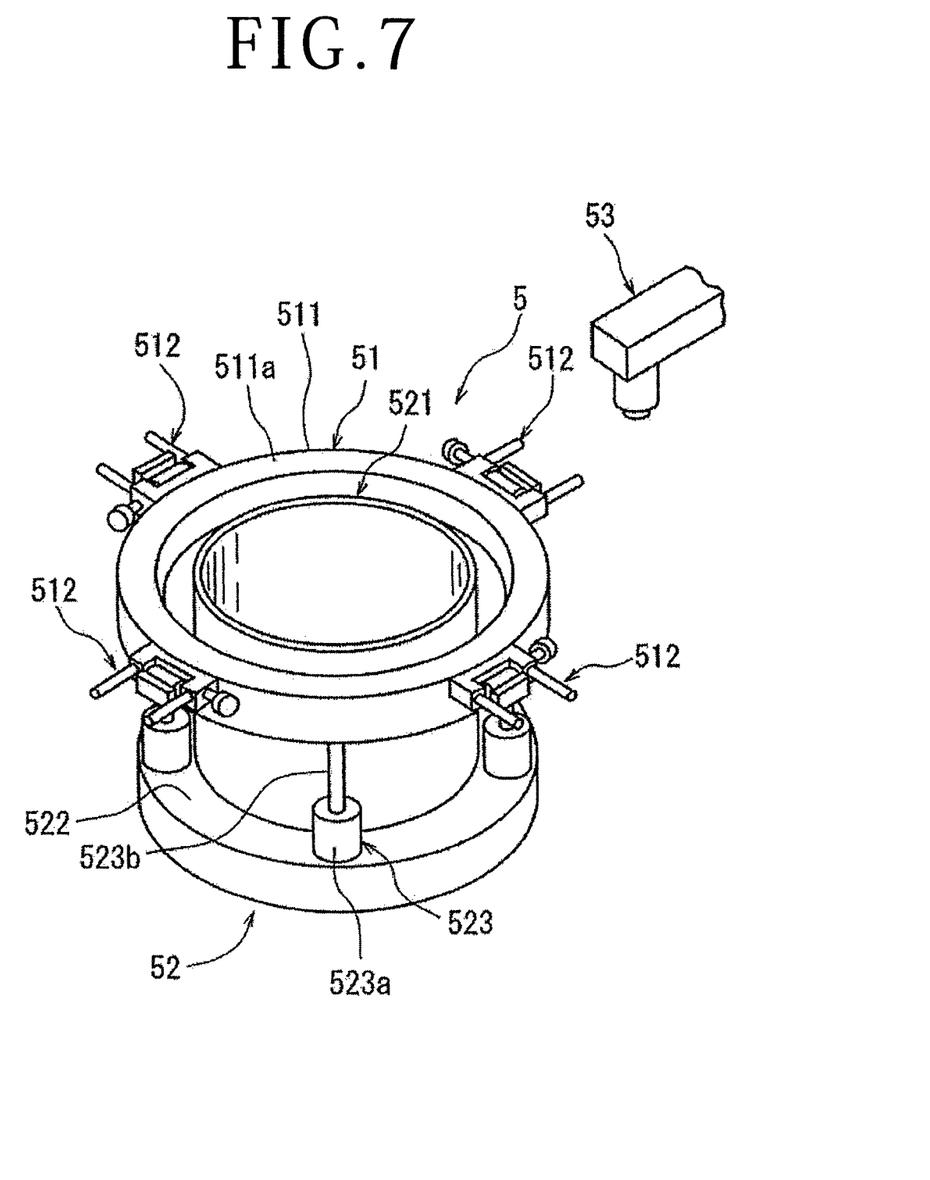
FIG. 7 is a perspective view of a dividing apparatus for dividing an optical device wafer wherein shield tunnels have been formed into individual optical devices.

After the above shield tunnel forming step has been carried out, a wafer dividing step is performed to apply an external force to the optical device wafer 2 to divide the optical device wafer 2 along the division lines 22 where the shield tunnels 23 including the fine holes 231 and the amorphous regions 232 formed around the fine holes 231 have been successively formed, into individual optical devices 21. The wafer dividing step is carried out using a dividing apparatus 5 shown in FIG. 7. As shown in FIG. 7, the dividing apparatus 5 includes frame holding means 51 for holding the annular frame 3, tape expanding means 52 for expanding the optical device wafer 2 mounted on the annular frame 3 that is held by the frame holding means 51, and a pickup collet 53. The frame holding means 51 includes an annular frame holder 511 and a plurality of clamps 512 disposed as fixing means on an outer circumferential surface of the frame holder 511. The frame holder 511 has an upper surface serving as a placement surface 511a for placing the annular frame 3 thereon. The annular frame 3 is placed on the placement surface 511a. The annular frame 3 that is placed on the placement surface 511a is fixed to the frame holder 511 by the clamps 512. The frame holder 511 thus constructed is supported by the tape expanding means 52 for vertical back-and-forth movement.

The tape expanding means 52 has an expanding drum 521 disposed in the annular frame holder 511. The expanding drum 521 has an inside diameter which is smaller than the inside diameter of the annular frame 3 and an outside diameter which is larger than the outside diameter of the optical device wafer 2 adhered to the dicing tape 30 which is mounted on the annular frame 3. The expanding drum 521 has a support flange 522 on its lower end. The tape expanding means 52 according to the present embodiment has support means 523 that supports the annular frame holder 511 for vertical back-and-forth movement. The support means 523 includes a plurality of air cylinders 523a disposed on the support flange 522 and having respective piston rods 523b connected to the lower surface of the annular frame holder 511. The support means 523 which includes the plurality of air cylinders 523a moves the annular frame holder 511 in the vertical direction between a reference position shown in FIG. 8A in which the placement surface 511a lies substantially at the same height as the upper end of the expanding drum 521 and an expanding position shown in FIG. 8B in which the placement surface 511a is lower in height than the upper end of the expanding drum 521 by a predetermined amount.

Figure 8A:
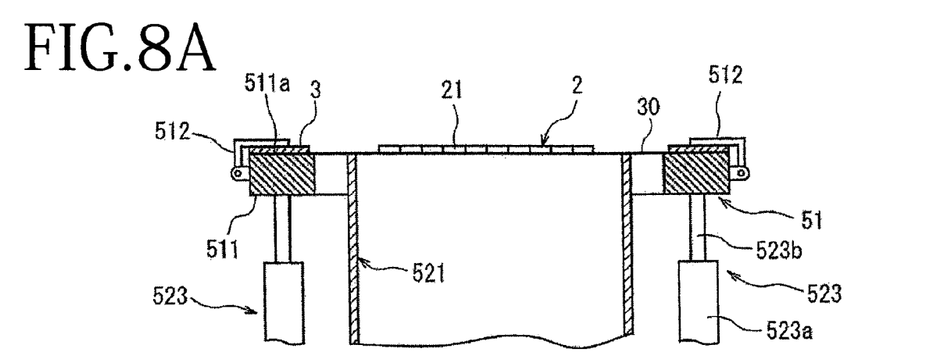
FIGS. 8A through 8C are views illustrating a wafer dividing step that is carried out by the dividing apparatus shown in FIG. 7.
Figure 8B:
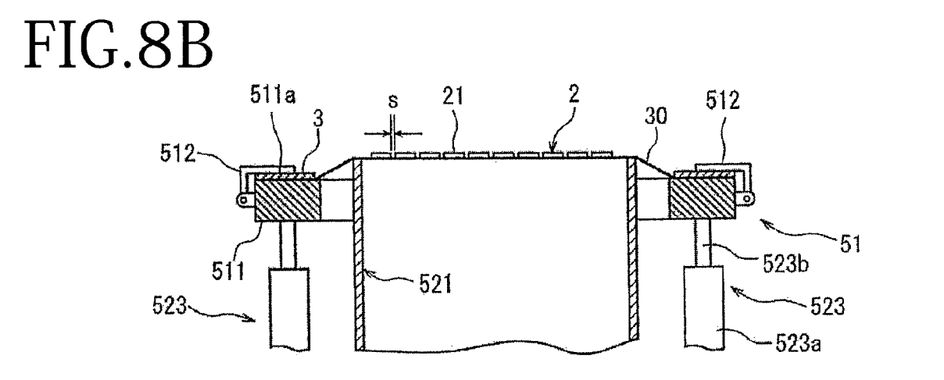

The wafer dividing step to be carried out using the dividing apparatus 5 thus constructed will be described below with reference to FIGS. 8A through 8C. As shown in FIG. 8A, the annular frame 3 on which the dicing tape 30 with the optical device wafer 2 adhered thereto is mounted is placed on the placement surface 511a of the frame holder 511 of the frame holding means 51, and is then fixed to the frame holder 511 by the clamps 512 (frame holding step). At this time, the frame holder 511 is positioned in the reference position shown in FIG. 8A. Thereafter, the air cylinders 523a as the support means 523 forming the tape expanding means 52 are actuated to lower the annular frame holder 511 to the expanding position shown in FIG. 8B. Since the annular frame 3 fixed to the placement surface 511a of the frame holder 511 is also lowered, the dicing tape 30 mounted on the annular frame 3 is expanded by contact with the upper end of the expanding drum 521 (tape expanding step), as shown in FIG. 8B. As a result, the optical device wafer 2 adhered to the dicing tape 30 is subjected to a radial tensile force which separates the individual optical devices 21 along the division lines 22 whose mechanical strength has been reduced by the above-described shield tunnels 23 continuously formed therein, forming widened gaps S between the optical devices 21.

Figure 8C:
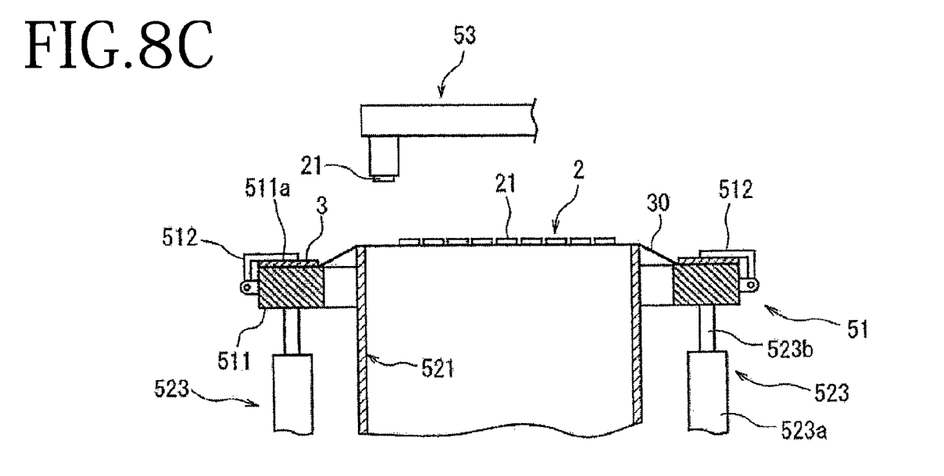

Then, as shown in FIG. 8C, the pickup collet 53 is actuated to attract one at a time of the optical devices 21 and pick it up from the dicing tape 30 (pickup step), and delivers the picked-up optical device 21 to a tray not depicted, or a die bonding step. In the pickup step, since the widened gaps S are formed between the individual optical devices 21 adhered to the dicing tape 30 as described above, the pickup collet 53 can easily pick up each optical device 21 without contact with the adjacent optical devices 21.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a single-crystal member, comprising:
    setting a peak energy density of a pulsed laser beam to a value in a range from 1 $TW/cm^2$ to 100 $TW/cm^2$; and
    applying the pulsed laser beam to the single-crystal member while positioning a converged point of the pulsed laser beam at a predetermined position spaced from an upper side of the single-crystal member to grow a fine hole and an amorphous region shielding the fine hole from the upper side of the single-crystal member, thereby forming a shield tunnel in the single-crystal member.

2. The method of processing a single-crystal member according to claim 1, further comprising:
    continuously forming the shield tunnels along a plurality of division lines formed on the single-crystal member; and
    dividing the single-crystal member along the division lines with the shield tunnels continuously formed therealong.

\* \* \* \* \*